United States Patent
Sakai et al.

(10) Patent No.: US 11,322,656 B2
(45) Date of Patent: May 3, 2022

(54) SEMICONDUCTOR LIGHT EMITTING ELEMENT AND METHOD OF MANUFACTURING SEMICONDUCTOR LIGHT EMITTING ELEMENT

(71) Applicant: NIKKISO CO., LTD., Tokyo (JP)

(72) Inventors: Haruhito Sakai, Hakusan (JP); Noritaka Niwa, Hakusan (JP); Tetsuhiko Inazu, Hakusan (JP)

(73) Assignee: NIKKISO CO., LTD., Tokyo (JP)

( * ) Notice: Subject to any disclaimer, the term of this patent is extended or adjusted under 35 U.S.C. 154(b) by 0 days.

(21) Appl. No.: 16/866,019

(22) Filed: May 4, 2020

(65) Prior Publication Data

US 2020/0266320 A1 Aug. 20, 2020

Related U.S. Application Data

(63) Continuation of application No. PCT/JP2018/036565, filed on Sep. 28, 2018.

(30) Foreign Application Priority Data

Nov. 10, 2017 (JP) .............................. JP2017-217547

(51) Int. Cl.
*H01L 33/40* (2010.01)
*H01L 33/32* (2010.01)
(Continued)

(52) U.S. Cl.
CPC .......... *H01L 33/405* (2013.01); *H01L 33/007* (2013.01); *H01L 33/0095* (2013.01);
(Continued)

(58) Field of Classification Search
CPC ............... H01L 33/007; H01L 33/0075; H01L 33/0095; H01L 33/32; H01L 2933/0016
See application file for complete search history.

(56) References Cited

U.S. PATENT DOCUMENTS

2007/0187666 A1* 8/2007 Watanabe ............. H01L 33/007
257/13
2015/0048304 A1* 2/2015 Niwa ................... H01L 33/0095
257/13
(Continued)

FOREIGN PATENT DOCUMENTS

JP H09129930 A 5/1997
JP 2004258219 A 9/2004
(Continued)

OTHER PUBLICATIONS

Office Action of JP Application No. 2017217547 and English translation, dated Dec. 18, 2018, 11 pages.
(Continued)

*Primary Examiner* — Julio J Maldonado
*Assistant Examiner* — Molly K Reida
(74) *Attorney, Agent, or Firm* — Muncy, Geissler, Olds & Lowe, P.C.

(57) ABSTRACT

A semiconductor light emitting element includes: an n-type clad layer of an n-type aluminum gallium nitride (AlGaN)-based semiconductor material; an active layer of an AlGaN-based semiconductor material provided on a first top surface of the n-type clad layer; and an n-side electrode provided on a second top surface of the n-type clad layer adjacent to the first top surface. The n-side electrode includes a first metal layer on the second top surface containing titanium (Ti) and a second metal layer on the first metal layer containing aluminum (Al). A root-mean-square roughness (Rq) of a top surface of the second metal layer is 5 nm or less.

4 Claims, 3 Drawing Sheets

(51) Int. Cl.
    *H01L 33/38*     (2010.01)
    *H01L 33/00*     (2010.01)
(52) U.S. Cl.
    CPC .............. *H01L 33/32* (2013.01); *H01L 33/38* (2013.01); *H01L 2933/0016* (2013.01)

(56) References Cited

U.S. PATENT DOCUMENTS

2017/0098739 A1    4/2017  Gaevski et al.
2018/0248080 A1*   8/2018  Toyota .................... C30B 25/18

FOREIGN PATENT DOCUMENTS

| | | |
|---|---|---|
| JP | 2012227494 A | 11/2012 |
| JP | 5594530 B | 9/2014 |
| JP | 2015103768 A | 6/2015 |
| WO | WO-2013/046419 A1 | 4/2013 |

OTHER PUBLICATIONS

Office Action of JP Application No. 2017217547 and English translation, dated Jul. 2, 2019, 13 pages.
International Search Report of PCT/JP2018/036565 and English translation, dated Dec. 25, 2018, 5 pages.
Inernational Preliminary Report on Patentability of PCT/JP2018/036565 and English translation, dated May 12, 2020, 21 pages.
Written Opinion of PCT/JP2018/036565 and English Translation, dated Dec. 10, 2018, 16 pages.

\* cited by examiner

SEMICONDUCTOR LIGHT EMITTING ELEMENT AND METHOD OF MANUFACTURING SEMICONDUCTOR LIGHT EMITTING ELEMENT

RELATED APPLICATION

This application is a Continuation of co-pending Application No. PCT/JP2018/036565, filed on Sep. 28, 2018, for which priority is claimed under 35 U.S.C. § 120; and this application claims priority of Application No. 2017-217547 filed in Japan on Nov. 10, 2017 under 35 U.S.C. § 119, the entire contents of all of which are hereby incorporated by reference.

BACKGROUND OF THE INVENTION

1. Field of the Invention

The present invention relates to a method of manufacturing semiconductor light emitting elements.

2. Description of the Related Art

A light emitting element for emitting deep ultraviolet light includes aluminum gallium nitride (AlGaN)-based n-type clad layer, active layer, and p-type clad layer stacked successively on a substrate. An n-side electrode having a stack structure of Ti/Al/Ti/Au is formed on a partial region of the n-type clad layer exposed by etching. It is known that the contact resistance between the n-type clad layer and the n-side electrode tends to increase as the AlN molar fraction in the n-type clad layer increases, making proper ohmic contact difficult. Annealing at 700° C. or higher is necessary to reduce the contact resistance of the n-side electrode.

Annealing at a temperature beyond the melting point (about 660° C.) of aluminum (Al), which is included in the n-side electrode, could result in a poorer post-annealing flatness of the n-side electrode and a lower post-annealing ultraviolet reflectivity of the n-side electrode.

SUMMARY OF THE INVENTION

The present invention addresses the above-described issue, and an illustrative purpose thereof is to provide a technology of improving the contact resistance and ultraviolet reflectivity of the n-side electrode of a semiconductor light emitting element.

A semiconductor light emitting element according to an embodiment includes: an n-type clad layer made of an n-type aluminum gallium nitride (AlGaN)-based semiconductor material; an active layer made of an AlGaN-based semiconductor material provided on a first top surface of the n-type clad layer; and an n-side electrode provided on a second top surface of the n-type clad layer adjacent to the first top surface. The n-side electrode includes a first metal layer on the second top surface containing titanium (Ti) and a second metal layer on the first metal layer containing aluminum (Al), and A root-mean-square roughness (Rq) of a top surface of the second metal layer is 5 nm or less.

According to this embodiment, the ultraviolet reflectivity of the n-side electrode is improved and the light extraction efficiency of the semiconductor light emitting element is enhanced by configuring the roughness (Rq) of the top surface of the second metal layer of the n-side electrode to be 5 nm or less.

A contact resistance between the n-side electrode and the n-type clad layer may be 0.1 $\Omega \cdot cm^2$ or smaller.

A thickness of the first metal layer may be 10 nm or smaller.

The molar fraction of aluminum nitride (AlN) of the n-type clad layer may be 20% or higher, and the n-type clad layer may contain silicon (Si) at a concentration of $1 \times 10^{18}$/$cm^3$ or higher. The active layer may be configured to emit ultraviolet light having a wavelength of 350 nm or shorter.

The n-side electrode may be configured such that reflectivity of ultraviolet light incident from the n-type clad layer is 40% or higher.

Another embodiment of the present invention relates to a method of manufacturing a semiconductor light emitting element. The method includes: forming an active layer made of an aluminum gallium nitride (AlGaN)-based semiconductor material on an n-type clad layer made of an n-type AlGaN-based semiconductor material; removing portions of the active layer and the n-type clad layer by dry etching so as to expose a portion of the n-type clad layer; forming a first metal layer containing titanium (Ti) on an exposed surface of the n-type clad layer and forming a second metal layer containing aluminum (Al) on the first metal layer; and annealing the first metal layer and the second metal layer at a temperature not lower than 500° C. and not higher than 650° C. to form an n-side electrode.

According to this embodiment, the flatness of the n-side electrode can be enhanced and the ultraviolet reflectivity is improved in the n-side electrode, by annealing the n-side electrode at a temperature of 650° C. or lower, which is lower than the Al melting point. Further, the n-side electrode is configured to have a contact resistance of 0.1 $\Omega \cdot cm^2$ or smaller by annealing the n-side electrode at a temperature of 500° C. or higher. According to this embodiment, the n-side electrode that meets both of the requirements for high ultraviolet reflectivity and low contact resistance can be formed so that the light extraction efficiency of the semiconductor light emitting element can be enhanced.

A thickness of the first metal layer may be 10 nm or smaller, and a contact resistance between the n-side electrode and the n-type clad layer may be 0.1 $\Omega \cdot cm^2$ or smaller.

The first metal layer and the second metal layer may be annealed for one minute or longer.

The first metal layer and the second metal layer may be annealed at a temperature of 600° C. for five minute or longer.

The portion of the n-type clad layer may be removed at an etching rate of 50 nm/minute or lower.

BRIEF DESCRIPTION OF THE DRAWINGS

Embodiments will now be described, by way of example only, with reference to the accompanying drawings that are meant to be exemplary, not limiting, and wherein like elements are numbered alike in several figures, in which.

DETAILED DESCRIPTION OF THE INVENTION

Figure 1:
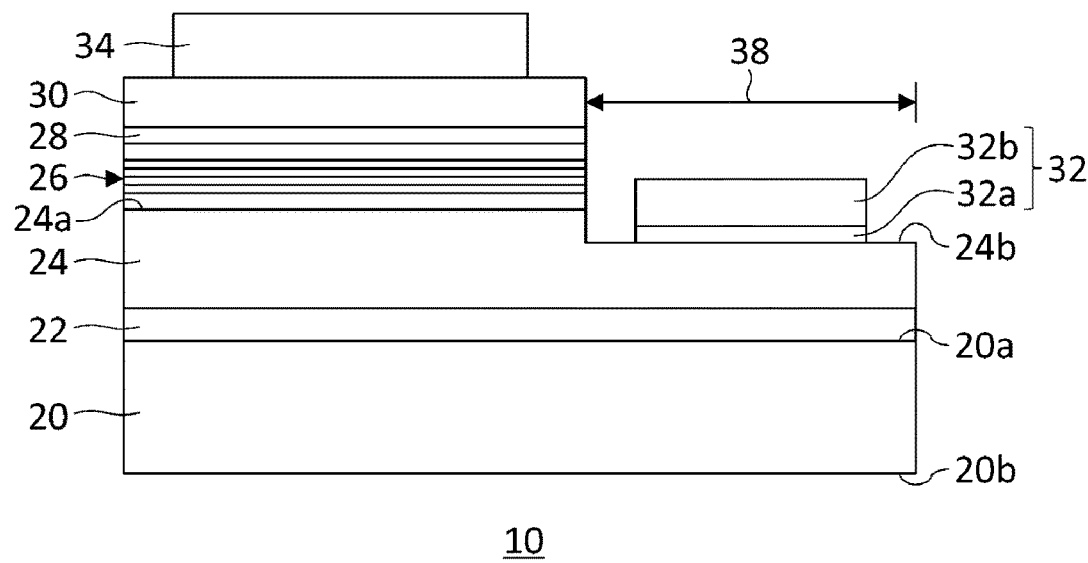
FIG. 1 is a cross-sectional view schematically showing a configuration of a semiconductor light emitting element according to the embodiment.

The invention will now be described by reference to the preferred embodiments. This does not intend to limit the scope of the present invention, but to exemplify the invention.

A detailed description will be given of an embodiment of the disclosure with reference to the drawings. The same numerals are used in the description to denote the same elements and a duplicate description is omitted as appropriate. To facilitate the understanding, the relative dimensions of the constituting elements in the drawings do not necessarily mirror the relative dimensions in the actual light emitting element.

FIG. 1 is a cross-sectional view schematically showing a configuration of a semiconductor light emitting element 10 according to the embodiment. The semiconductor light emitting element 10 is a light emitting diode (LED) chip configured to emit "deep ultraviolet light" having a central wavelength λ of about 360 nm or shorter. To output deep ultraviolet light having such a wavelength, the semiconductor light emitting element 10 is made of an aluminum gallium nitride (AlGaN)-based semiconductor material having a band gap of about 3.4 eV or larger. In the embodiment, emission of deep ultraviolet light having a central wavelength λ of about 240 nm-350 nm is discussed.

In this specification, the term "AlGaN-based semiconductor material" refers to a semiconductor material mainly containing aluminum nitride (AlN) and gallium nitride (GaN) and shall encompass a semiconductor material containing other materials such as indium nitride (InN). Therefore, "AlGaN-based semiconductor materials" as recited in this specification can be represented by a composition $In_{1-x-y}Al_xGa_yN$ ($0 \leq x+y \leq$, $0 \leq x \leq 1$, $0 \leq y \leq 1$). The AlGaN-based semiconductor material shall contain AlN, GaN, AlGaN, indium aluminum nitride (InAlN), indium gallium nitride (InGaN), or indium aluminum gallium nitride (InAlGaN).

Of "AlGaN-based semiconductor materials", those materials that do not substantially contain AlN may be distinguished by referring to them as "GaN-based semiconductor materials". "GaN-based semiconductor materials" mainly contain GaN or InGaN and encompass materials that additionally contain a slight amount of AlN. Similarly, of "AlGaN-based semiconductor materials", those materials that do not substantially contain GaN may be distinguished by referring to them as "AlN-based semiconductor materials". "AlN-based semiconductor materials" mainly contain AlN or InAlN and encompass materials that additionally contain a slight amount of GaN.

The semiconductor light emitting element 10 includes a substrate 20, a buffer layer 22, an n-type clad layer 24, an active layer 26, an electron blocking layer 28, a p-type clad layer 30, an n-side electrode 32, and a p-side electrode 34.

The substrate 20 is a substrate having translucency for the deep ultraviolet light emitted by the semiconductor light emitting element 10 and is, for example, a sapphire ($Al_2O_3$) substrate. The substrate 20 includes a first principal surface 20a and a second principal surface 20b opposite to the first principal surface 20a. The first principal surface 20a is a principal surface that is a crystal growth surface for growing the buffer layer 22 and the layers above. The second principal surface 20b is a principal surface that is a light extraction surface for extracting the deep ultraviolet light emitted by the active layer 26 outside. In one variation, the substrate 20 may be an aluminum nitride (AlN) substrate or an aluminum gallium nitride (AlGaN) substrate.

The buffer layer 22 is formed on the first principal surface 20a of the substrate 20. The buffer layer 22 is a foundation layer (template layer) to form the n-type clad layer 24 and the layers above. For example, the buffer layer 22 is an undoped AlN layer and is, specifically, an AlN (HT-AlN; High Temperature AlN) layer grown at a high temperature. The buffer layer 22 may include an undoped AlGaN layer formed on the AlN layer. In one variation, the buffer layer 22 may be comprised only of an undoped AlGaN layer in the case the substrate 20 is an AlN substrate or an AlGaN substrate. In other words, the buffer layer 22 includes at least one of undoped AlN layer and AlGaN layer.

The n-type clad layer 24 is formed on the buffer layer 22. The n-type clad layer 24 is an n-type AlGaN-based semiconductor material layer. For example, the n-type clad layer 24 is an AlGaN layer doped with silicon (Si) as an n-type impurity. The composition ratio of the n-type clad layer 24 is selected to transmit the deep ultraviolet light emitted by the active layer 26. For example, the n-type clad layer 24 is formed such that the molar fraction of AlN is 25% or higher, and, preferably, 40% or higher or 50% or higher. The n-type clad layer 24 has a band gap larger than the wavelength of the deep ultraviolet light emitted by the active layer 26. For example, the n-type clad layer 24 is formed to have a band gap of 4.3 eV or larger. It is preferable to form the n-type clad layer 24 such that the molar fraction of AlN is 80% or lower, i.e., the band gap is 5.5 eV or smaller. It is more preferable to form the n-type clad layer 24 such that the molar fraction of AlN is 70% or lower (i.e., the band gap is 5.2 eV or smaller). The n-type clad layer 24 has a thickness of about 1 μm-3 μm. For example, the n-type clad layer 24 has a thickness of about 2 μm.

The n-type clad layer 24 is formed such that the concentration of silicon (Si) as the impurity is not lower than $1 \times 10^{18}/cm^3$ and not higher than $5 \times 10^{19}/cm^3$. It is preferred to form the n-type clad layer 24 such that the Si concentration is not lower than $5 \times 10^{18}/cm^3$ and not higher than $3 \times 10^{19}/cm^3$, and, more preferably, not lower than $7 \times 10^{18}/cm^3$ and not higher than $2 \times 10^{19}/cm^3$. In one example, the Si concentration in the n-type clad layer 24 is around $1 \times 10^{19}/cm^3$ and is in a range not lower than $8 \times 10^{18}/cm^3$ and not higher than $1.5 \times 10^{19}/cm^3$.

The active layer 26 is made of an AlGaN-based semiconductor material and has a double heterojunction structure by being sandwiched between the n-type clad layer 24 and the electron blocking layer 28. The active layer 26 may have a monolayer or multilayer quantum well structure. For example, the active layer 26 may be formed by a stack of a barrier layer made of an undoped AlGaN-based semiconductor material and a well layer made of an undoped AlGaN-based semiconductor material. To output deep ultraviolet light having a wavelength of 355 nm or shorter, the active layer 26 is formed to have a band gap of 3.4 eV or larger. For example, the AlN composition ratio of the active layer 26 is selected so as to output deep ultraviolet light having a wavelength of 310 nm or shorter. The active layer 26 is formed on a first top surface 24a of the n-type clad layer 24 and is not formed on a second top surface 24b adjacent to the first top surface 24a. The active layer 26 is not formed on the entirety of the n-type clad layer 24 and is formed only in a partial region (a region different from the exposed region 38) of the n-type clad layer 24.

The electron blocking layer 28 is formed on the active layer 26. The electron blocking layer 28 is a p-type AlGaN-based semiconductor material layer and is formed such that the molar fraction of AlN is 40% or higher, and, preferably, 50% or higher. The electron blocking layer 28 may be formed such that the molar fraction of AlN is 80% or higher or may be made of an AlN-based semiconductor material that does not substantially contain GaN. The electron blocking layer has a thickness of about 1 nm-10 nm. For example, the electron blocking layer has a thickness of about 2 nm-5 nm. The electron blocking layer 28 may not be a p-type layer and may be an undoped semiconductor layer.

The p-type clad layer 30 is a p-type semiconductor layer formed on the electron blocking layer 28. The p-type clad layer 30 is a p-type AlGaN-based semiconductor material layer. For example, the p-type clad layer 30 is an AlGaN layer doped with magnesium (Mg) as a p-type impurity. The p-type clad layer 30 has a thickness of about 300 nm-700 nm. For example, the p-type clad layer 30 has a thickness of about 400 nm-600 nm. The p-type clad layer 30 may be made of a p-type GaN-based semiconductor material that does not substantially contain AlN.

The n-side electrode 32 is formed on the second top surface 24b of the n-type clad layer 24. The n-side electrode 32 is formed by a multilayer film in which a first metal layer 32a and a second metal layer 32b are stacked on the second top surface 24b. The n-side electrode 32 is a so-called Ti/Al-based electrode. The first metal layer 32a includes titanium (Ti), and the second metal layer 32b includes aluminum (Al).

The p-side electrode 34 is formed on the p-type clad layer 30. The p-side electrode 34 is formed by a multilayer film of nickel (Ni)/gold (Au) stacked on the p-type clad layer 30 successively.

Figure 2:
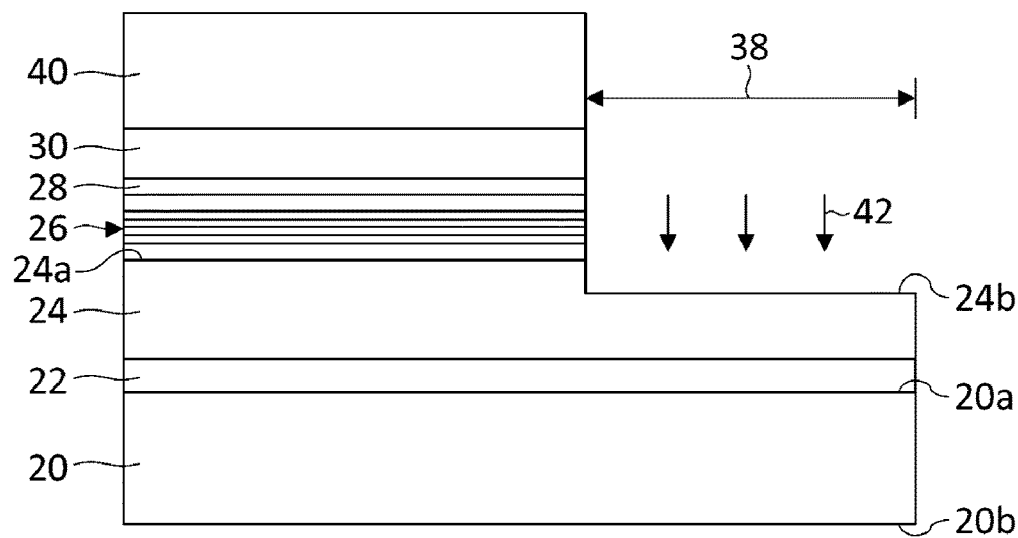
FIG. 2 schematically shows a step of manufacturing the semiconductor light emitting element.

A description will now be given of a method of manufacturing the semiconductor light emitting element 10. FIG. 2 schematically shows a step of manufacturing the semiconductor light emitting element 10. First, the buffer layer 22, the n-type clad layer 24, the active layer 26, the electron blocking layer 28, and the p-type clad layer 30 are formed on the first principal surface 20a of the substrate 20 successively.

The substrate 20 is a sapphire ($Al_2O_3$) substrate and is a growth substrate for forming an AlGaN-based semiconductor material. For example, the buffer layer 22 is formed on the (0001) plane of the sapphire substrate. The buffer layer 22 includes, for example, an AlN (HT-AlN) layer grown at a high temperature and an undoped AlGaN (u-AlGaN) layer. The n-type clad layer 24, the active layer 26, the electron blocking layer 28, and the p-type clad layer 30 are layers made of an AlGaN-based semiconductor material, an AlN-based semiconductor material, or a GaN-based semiconductor material and can be formed by a well-known epitaxial growth method such as the metal organic vapor phase epitaxy (MOVPE) method or the molecular beam epitaxial (MBE) method.

Subsequently, a mask 40 is formed on the p-type clad layer 30. A portion of each of the p-type clad layer 30, the electron blocking layer 28, the active layer 26, and the n-type clad layer 24 in an exposed region 38, in which the mask 40 is not formed, is removed. This forms the second top surface 24b (exposed surface) of the n-type clad layer 24 in the exposed region 38. In the step of forming the exposed surface of the n-type clad layer 24, these layers can be removed by dry etching. For example, reactive ion etching using an etching gas turned into plasma can be used. For example, inductive coupling plasma (ICP) etching may be used.

In the step of forming the exposed surface of the n-type clad layer 24, it is preferred to use an etching rate of 50 nm/minute or lower, or more preferably, an etching rate of 13 nm/minute or lower or 2 nm/minute or lower in order to prevent the crystal quality of the second top surface 24b from becoming poorer by dry etching. It is not necessary to lower the etching rate of all layers from the p-type clad layer 30 to the n-type clad layer 24. For example, the p-type clad layer 30, the electron blocking layer 28, and the active layer 26 may be dry-etched at a high etching rate (e.g., 100 nm/minute or higher), and only the n-type clad layer 24 may be dry-etched at a low etching rate (e.g., 100 nm/minute or lower).

In the step of dry etching at a high etching rate described above, dry etching may be performed by combining a reactive gas and an inert gas. A gas including chlorine (Cl) such as chlorine ($Cl_2$), boron trichloride ($BCl_3$), and silicon tetrachloride ($SiCl_4$) can be used as the reactive gas, and a noble gas such as argon (Ar) can be used as the inert gas. Meanwhile, only a reactive gas is used and an inert gas is not used in the dry etching at a low etching rate and then the crystal quality is prevented from becoming poorer due to the physical action of removal by the inert gas.

Subsequently, the first metal layer 32a that is a Ti layer is formed on the second top surface 24b (exposed surface) of the n-type clad layer 24, and the second metal layer 32b that is an Al layer is then formed. The thickness of the first metal layer 32a is about 1 nm-10 nm, and the thickness of the second metal layer 32b is about 20 nm-1000 nm. The first metal layer 32a and the second metal layer 32b can be formed by sputtering or electron beam (EB) deposition.

The n-side electrode 32 is annealed after the first metal layer 32a and the second metal layer 32b are formed. Annealing of the n-side electrode 32 is performed at a temperature lower than the melting point of Al (about 660° C.) and, for example, at an annealing temperature not lower than 500° C. and not higher than 650° C. The annealing temperature not lower than 500° C. and not higher than 650° C. can ensure that the contact resistance of the n-side electrode 32 is about 0.1 $\Omega \cdot cm^2$ or smaller and can increase flatness and ultraviolet reflectivity of the n-side electrode 32 after annealing. Further, a suitable contact resistance is obtained even when annealing is performed for one minute or longer (e.g., about five minutes-thirty minutes) by annealing at a temperature below the melting point of Al. In the case a plurality of element portions are formed on one substrate, securing longer annealing time (one minute or more) makes it possible to enhance temperature uniformity in the substrate during annealing and to allow a plurality of semiconductor light emitting elements with little characteristic variation to be formed at the same time.

Subsequently, the p-side electrode 34 is formed on the p-type clad layer 30 after the mask 40 is removed. The p-side electrode 34 may be formed by a well-known method such as electron beam deposition and sputtering. This completes the formation of the semiconductor light emitting element 10 shown in FIG. 1.

Figure 3:
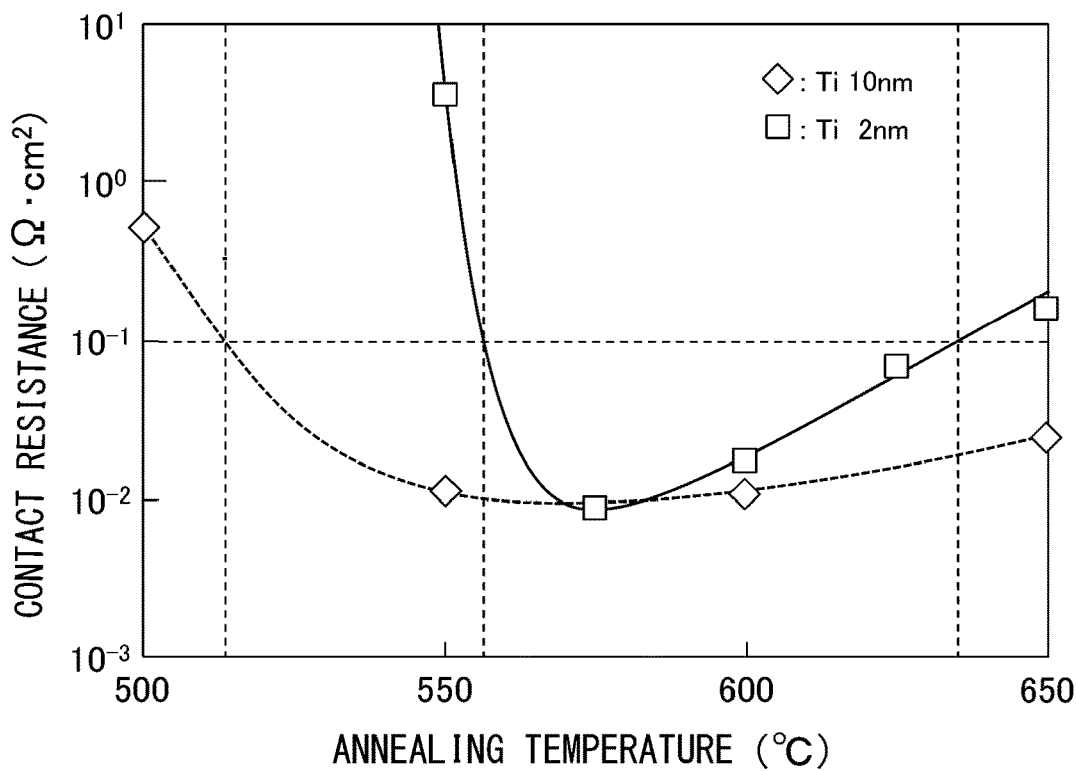
FIG. 3 is a graph showing a relationship between the annealing temperature and the contact resistance of the n-side electrode.

FIG. 3 is a graph showing a relationship between the annealing temperature and the contact resistance of the n-side electrode 32 and shows cases in which the thickness of the first metal layer 32a (Ti layer) is 2 nm and 10 nm, respectively. In the case the thickness of the first metal layer 32a (Ti layer) is 2 nm, a low contact resistance of 0.01

Ω·cm² or smaller is realized at an annealing temperature of 575° C., and a low contact resistance of 0.1 Ω·cm² or smaller can be realized at an annealing temperature not lower than 560° C. and not higher than 640° C. In the case the thickness of the first metal layer 32a (Ti layer) is 10 nm, a low contact resistance of about 0.01 Ω·cm² is realized at an annealing temperature not lower than 550° C. and not higher than 600° C., and a low contact resistance of 0.1 Ω·cm² or smaller can be realized at an annealing temperature not lower than 515° C. and not higher than 650° C. Therefore, a low contact resistance of 0.1 Ω·cm² is realized by configuring the thickness of the first metal layer 32a (Ti layer) to be 2 nm. Meanwhile, a suitable contact resistance of 0.1 Ω·cm² or smaller is realized in a wider temperature range by configuring the thickness of the first metal layer 32a (Ti layer) to be 10 nm.

Figure 4:
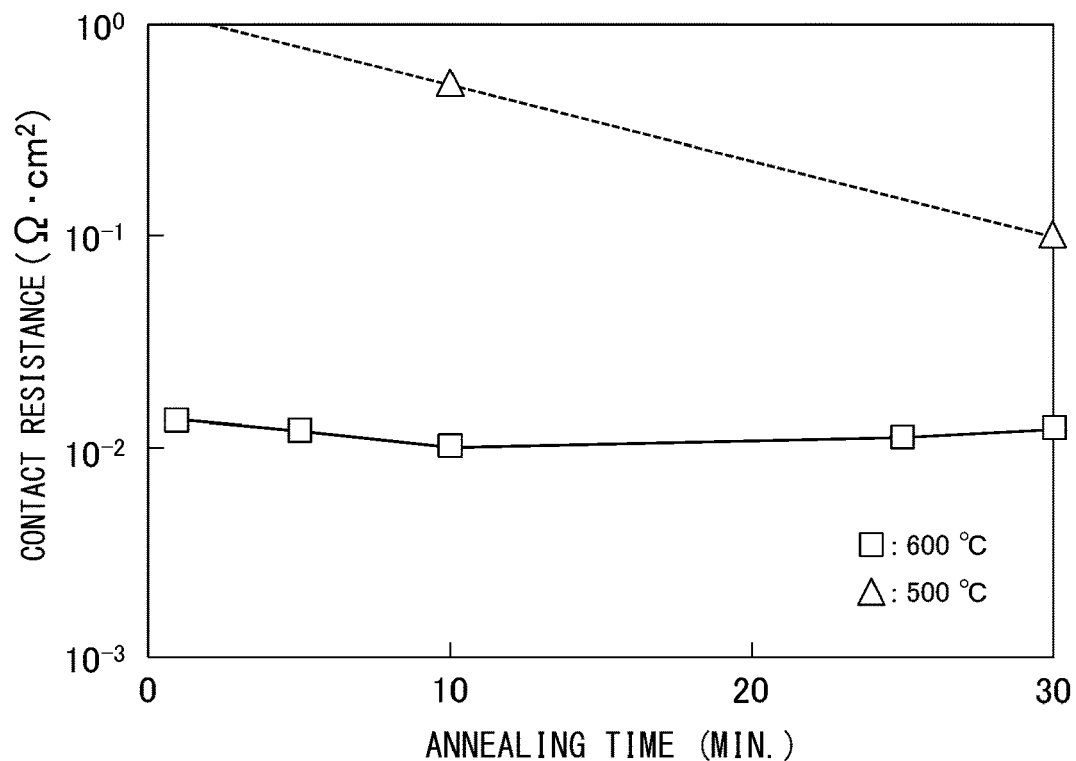
FIG. 4 is a graph showing a relationship between the annealing time and the contact resistance of the n-side electrode.

FIG. 4 is a graph showing a relationship between the annealing time and the contact resistance of the n-side electrode 32. The graph shows cases in which the thickness of the first metal layer 32a (Ti layer) is 10 nm, the annealing temperature being 500° C. in one case and 600° C. in the other. In the case the annealing temperature is 500° C., the contact resistance tends to be lower as the annealing time is extended. The annealing time of 30 minutes realizes a low contact resistance of about 0.1 Ω·cm². In the case the annealing temperature is 600° C., on the other hand, the value of contact resistance does not vary so much in a range of annealing time of 1 minute-30 minutes, and a low contact resistance of about 0.01 Ω·cm² is realized.

Figure 5:
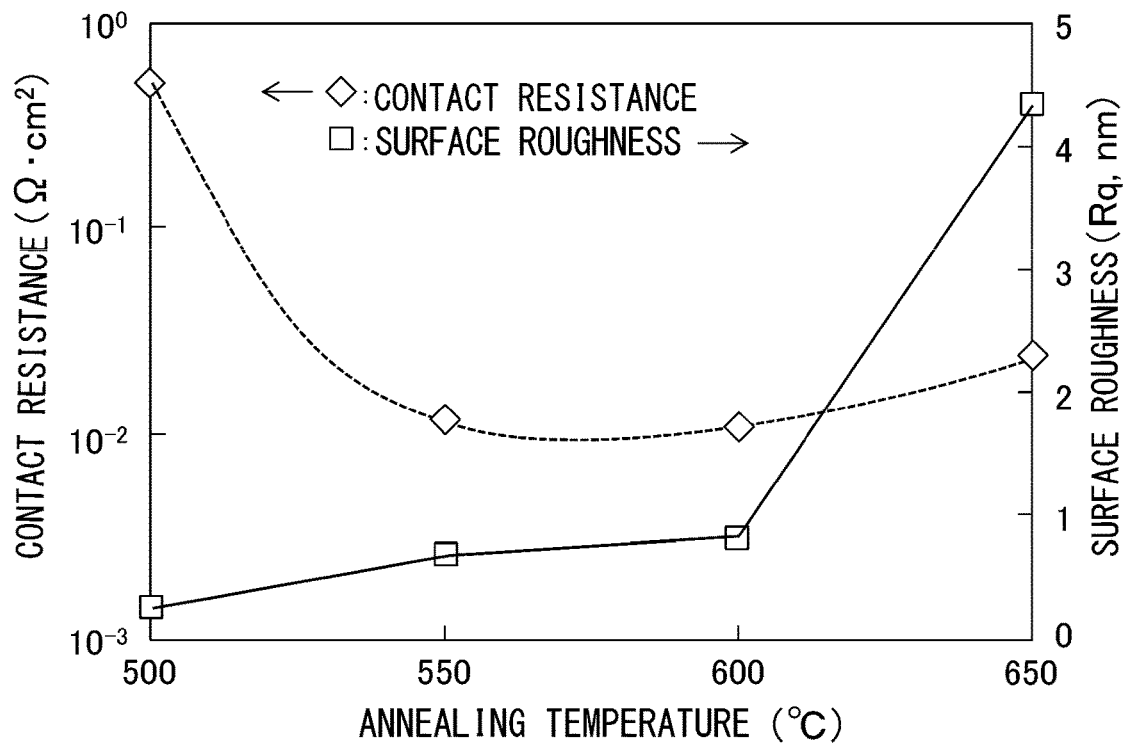
FIG. 5 is a graph showing a relationship between the annealing temperature and the contact resistance of the n-side electrode.

FIG. 5 is a graph showing a relationship between the annealing temperature and the contact resistance of the n-side electrode 32. The graph shows a case in which the thickness of the first metal layer 32a (Ti layer) is 10 nm, and the annealing time is 10 minutes. The flatness of the n-side electrode 32 shown in the graph is surface roughness of the top surface of the second metal layer 32b (Al layer) and a root-mean-square height (Rq, Rrms). As shown in the graph, the flatness of the n-side electrode 32 is 5 nm or less in a range of annealing temperature of 500° C.-650° C. and is of a more suitable value equal to or less than 1 nm in a range of annealing temperature of 500° C.-600° C. In the case the thickness of the first metal layer 32a (Ti layer) is 2 nm, a more suitable flatness is obtained than in the case in which the thickness of the first metal layer 32a (Ti layer) is 10 nm.

Figure 6:
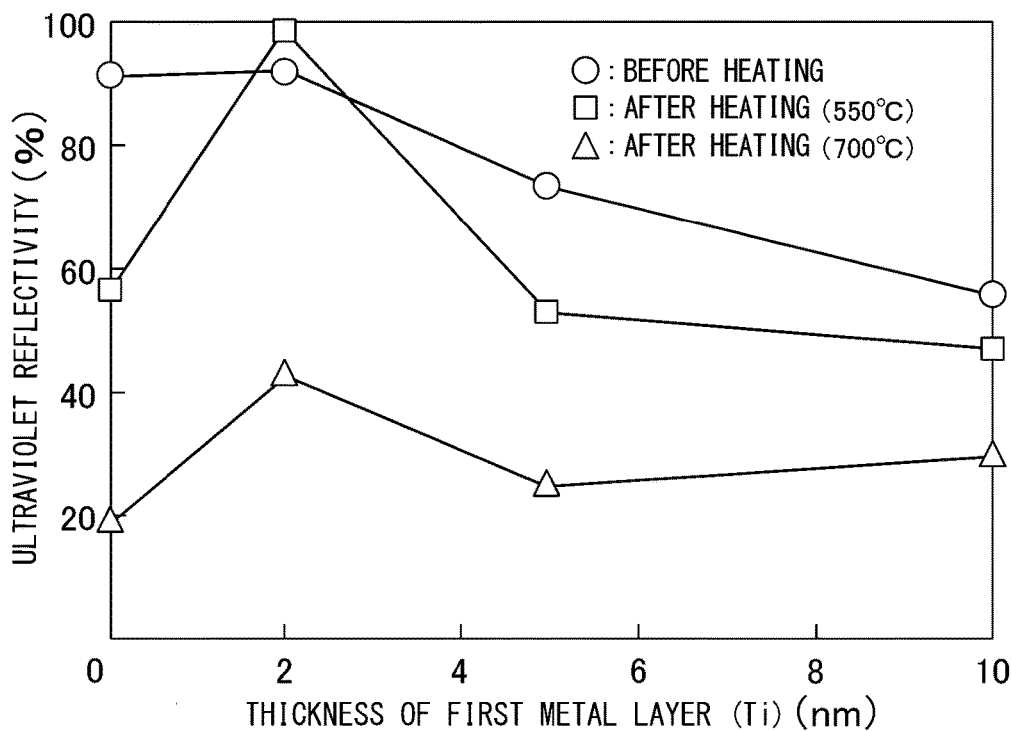
FIG. 6 is a graph showing a relationship between the thickness of the first metal layer and the ultraviolet reflectivity.

FIG. 6 is a graph showing a relationship between the thickness of the first metal layer 32a (Ti layer) and the ultraviolet reflectivity and shows variation in the ultraviolet reflectivity of the n-side electrode 32 with the change in the thickness of the first metal layer 32a and the annealing temperature. As shown in the graph, it is known that reflectivity of the n-side electrode 32 after annealing tends to drop from reflectivity of the n-side electrode 32 before annealing, and, in particular, the ultraviolet reflectivity drops significantly after annealing at 700° C., which exceeds the melting point of Al. It is also known that the n-side electrode 32 having an even higher ultraviolet reflectivity is obtained by configuring the thickness of the first metal layer 32a to be about 2 nm. Since the higher the ultraviolet reflectivity of the n-side electrode 32, the more the flatness of the n-side electrode 32 tends to be improved, the n-side electrode 32 having a high flatness is obtained by lowering the annealing temperature. It is also known that the n-side electrode 32 having a high ultraviolet reflectivity is obtained also by configuring the thickness of the first metal layer 32a (Ti layer) to be small.

The graphs of FIGS. 3-6 reveal that the thickness of the first metal layer 32a (Ti layer) of 10 nm and the annealing temperature not lower than 515° C. and not higher than 650° C. make it possible to obtain the n-side electrode 32 capable of meeting all of the requirements for contact resistance of 0.1 Ω·cm² or smaller, flatness defined by the surface roughness (Rq) of 5 nm or less, and ultraviolet reflectivity of 40% or higher. Further, the annealing temperature not lower than 550° C. and not higher than 600° C. realizes contact resistance of about 0.01 Ω·cm² and flatness defined by the surface roughness (Rq) of 1 nm or less.

The thickness of the first metal layer 32a (Ti layer) of 2 nm and the annealing temperature not lower than 560° C. and not higher than 640° C. make it possible to obtain the n-side electrode 32 capable of meeting all of the requirements for contact resistance of 0.1 Ω·cm² or smaller, flatness defined by the surface roughness (Rq) of 5 nm or less, and ultraviolet reflectivity of 40% or higher. Further, the annealing temperature of about 575° C. realizes contact resistance of about 0.01 Ω·cm² and flatness defined by the surface roughness (Rq) of 1 nm or less.

According to this embodiment, the n-side electrode 32 that meets both of the requirements for suitable contact resistance and suitable ultraviolet reflectivity is provided so that the light extraction efficiency of the semiconductor light emitting element 10 is enhanced.

According to this embodiment, the reliability of the semiconductor light emitting element 10 is enhanced by improving the flatness of the n-side electrode 32. An oxide electrode layer for protecting the n-side electrode 32, a pad electrode or a wiring layer for connecting an external connection terminal of the semiconductor light emitting element 10 with the n-side electrode 32, an insulating layer for providing insulation between wiring layers, etc. may be formed on the n-side electrode 32. In the case the flatness of the n-side electrode 32 is low and a concavity or a convexity exceeding 10 nm or 100 nm is formed, that might affect the flatness of the stack structure formed on the n-side electrode 32 with the result that the thickness of the stack structure may be uneven, or a local stress may be exerted in a portion of the stack structure. Further, it is not easy to apply a physicochemical process (such as polishing) that will enhance the flatness of the top surface of the n-side electrode 32 after the n-side electrode 32 is formed. According to this embodiment, the flatness of the top surface of the n-side electrode 32 can be formed after the n-side electrode 32 is annealed so that it is easy to form a stack structure having a uniform thickness on the n-side electrode 32 and the reliability is inhibited from being lowered due to an uneven stack structure.

Described above is an explanation based on an exemplary embodiment. The embodiment is intended to be illustrative only and it will be understood by those skilled in the art that various design changes are possible and various modifications are possible and that such modifications are also within the scope of the present invention.

What is claimed is:

1. A method of manufacturing a semiconductor light emitting element comprising:
   forming an active layer made of an aluminum gallium nitride (AlGaN)-based semiconductor material on an n-type clad layer made of an n-type AlGaN-based semiconductor material;
   removing portions of the active layer and the n-type clad layer by dry etching so as to expose a portion of the n-type clad layer;
   forming a first metal layer containing titanium (Ti) on an exposed surface of the n-type clad layer and forming a second metal layer containing aluminum (Al) on and in direct contact with the first metal layer; and annealing the first metal layer and the second metal layer at a temperature not lower than 500° C. and not higher than 650° C. to form an n-side electrode, wherein an AlN molar fraction in the n-type clad layer is 40% or higher, wherein a thickness of the first metal layer is 10 nm or smaller, and wherein a contact resistance between the n-side electrode and the n-type clad layer is 0.1 $\Omega \cdot cm^2$ or smaller.

2. The method of manufacturing a semiconductor light emitting element according to claim 1, wherein the first metal layer and the second metal layer are annealed for one minute or longer.

3. The method of manufacturing a semiconductor light emitting element according to claim 1, wherein the first metal layer and the second metal layer are annealed at a temperature of 600° C. for five minute or longer.

4. The method of manufacturing a semiconductor light emitting element according to claim 1, wherein the portion of the n-type clad layer is removed at an etching rate of 50 nm/minute or lower.

* * * * *